(12) United States Patent
Azimi

(10) Patent No.: US 6,721,913 B1
(45) Date of Patent: Apr. 13, 2004

(54) METHOD AND APPARATUS FOR TESTING AN INTERFACE BETWEEN SEPARATE HARDWARE COMPONENTS

(75) Inventor: Saeed Azimi, Union City, CA (US)

(73) Assignee: Marvell International, Ltd., Hamilton (BM)

( * ) Notice: Subject to any disclaimer, the term of this patent is extended or adjusted under 35 U.S.C. 154(b) by 632 days.

(21) Appl. No.: 09/615,063

(22) Filed: Jul. 12, 2000

Related U.S. Application Data

(60) Provisional application No. 60/199,277, filed on Apr. 24, 2000.

(51) Int. Cl.[7] .............................................. G01R 31/28
(52) U.S. Cl. ...................................... 714/734; 324/73.1
(58) Field of Search ................................ 714/734, 724; 324/73.1, 724

(56) References Cited

U.S. PATENT DOCUMENTS

| | | | | |
|---|---|---|---|---|
| 5,313,158 A | * | 5/1994 | Joosten et al. | 324/158.1 |
| 5,617,431 A | * | 4/1997 | Tupuri et al. | 714/738 |
| 5,968,192 A | * | 10/1999 | Kornachuk et al. | 714/724 |
| 6,191,603 B1 | * | 2/2001 | Muradali et al. | 324/765 |
| 6,289,472 B1 | * | 9/2001 | Antheunisse et al. | 714/25 |
| 6,405,335 B1 | * | 6/2002 | Whetsel | 714/726 |
| 6,560,734 B1 | * | 5/2003 | Whetsel | 714/724 |

* cited by examiner

*Primary Examiner*—Albert Decady
*Assistant Examiner*—Esaw Abraham

(57) ABSTRACT

An interface testing circuit and method for testing an interface between two or more separate hardware components provides interface testing capability without requiring complex and expensive synchronized mixed signal testing between the hardware components. The interface testing circuit includes two or more sub-circuits, each of which is adapted to selectively route either a test signal from a test input/output pad to a hardware component or route an output signal from another hardware component to the test pad. Multiple testing modes are used to fully test the interface.

30 Claims, 4 Drawing Sheets

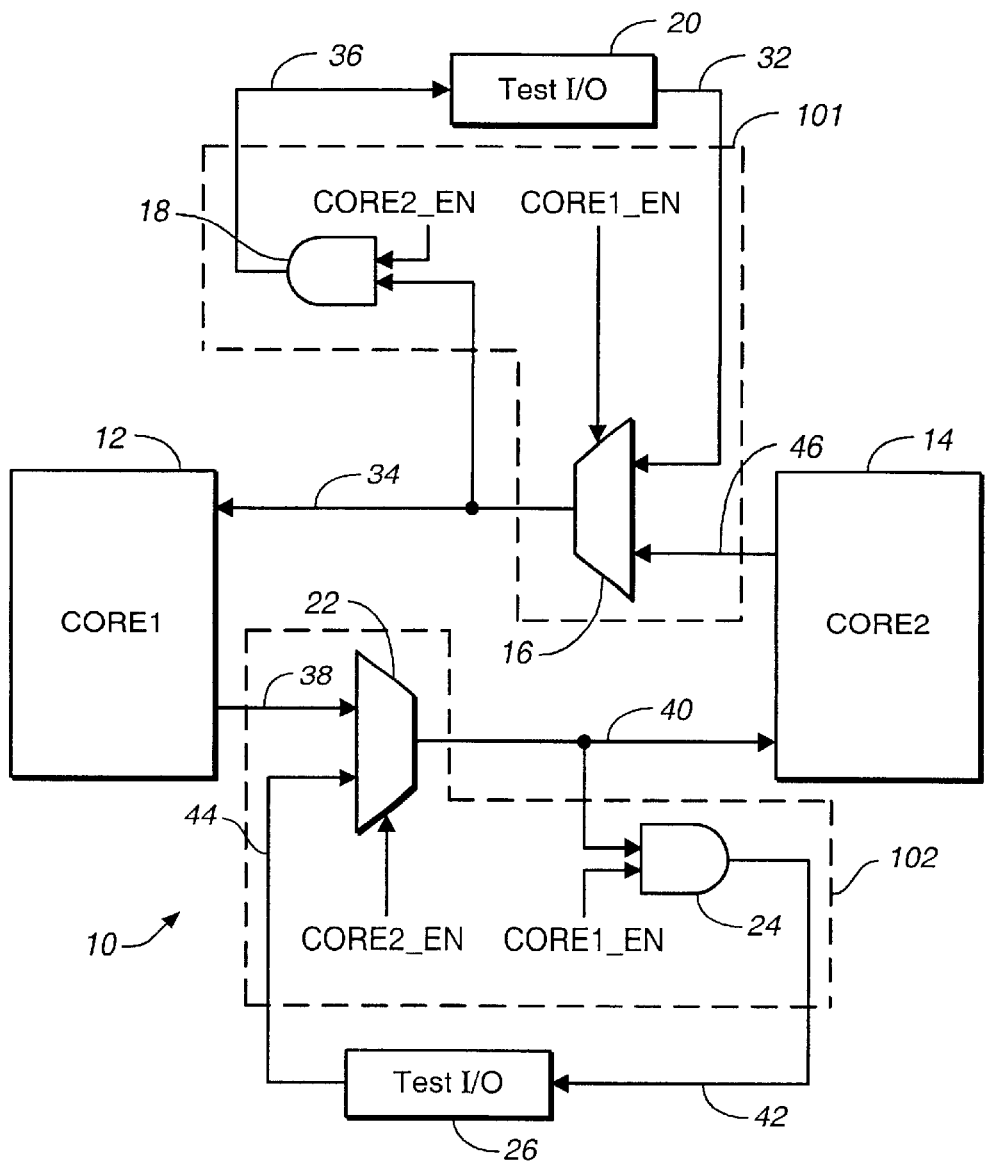
FIG._1

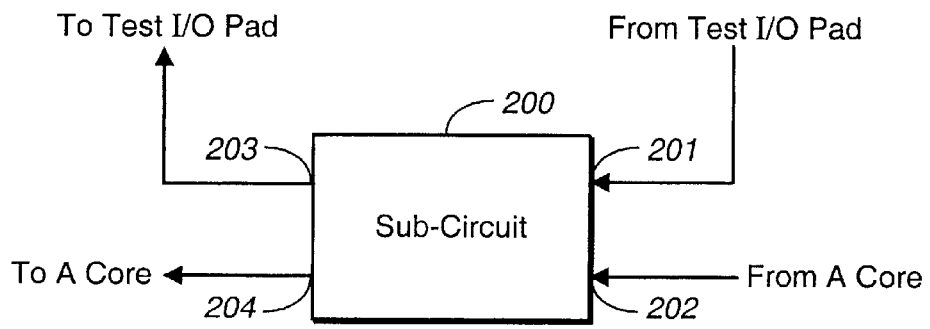
FIG._2
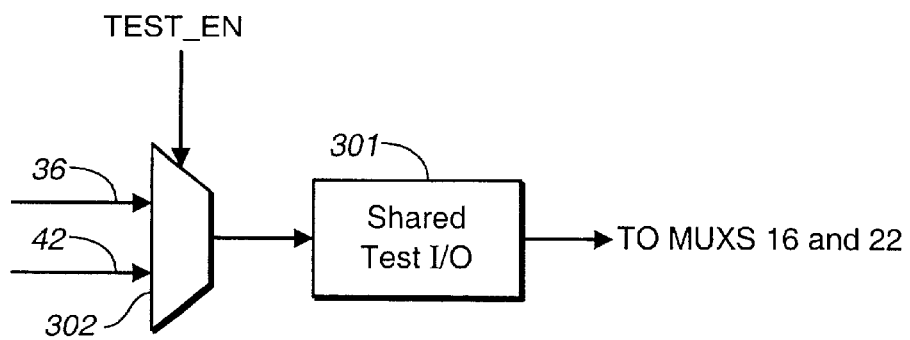
FIG._3
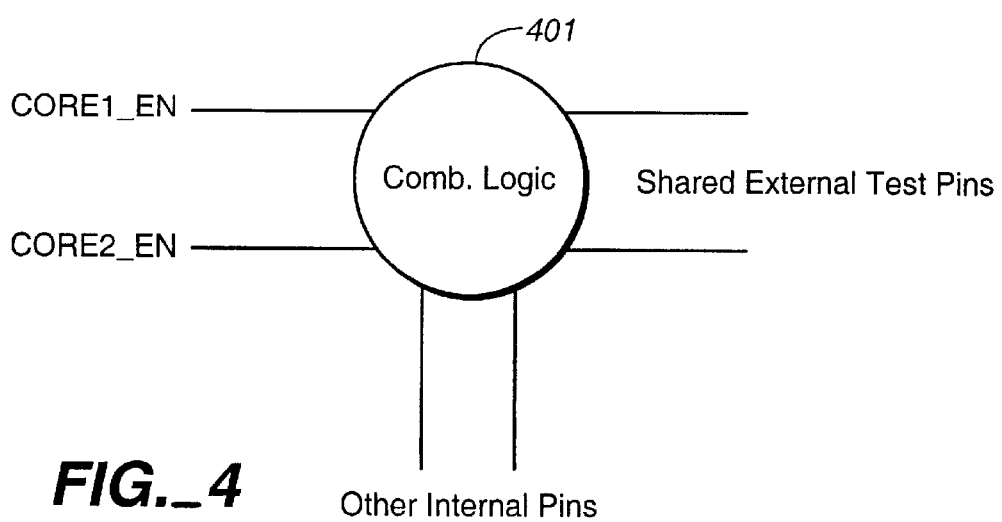
FIG._4

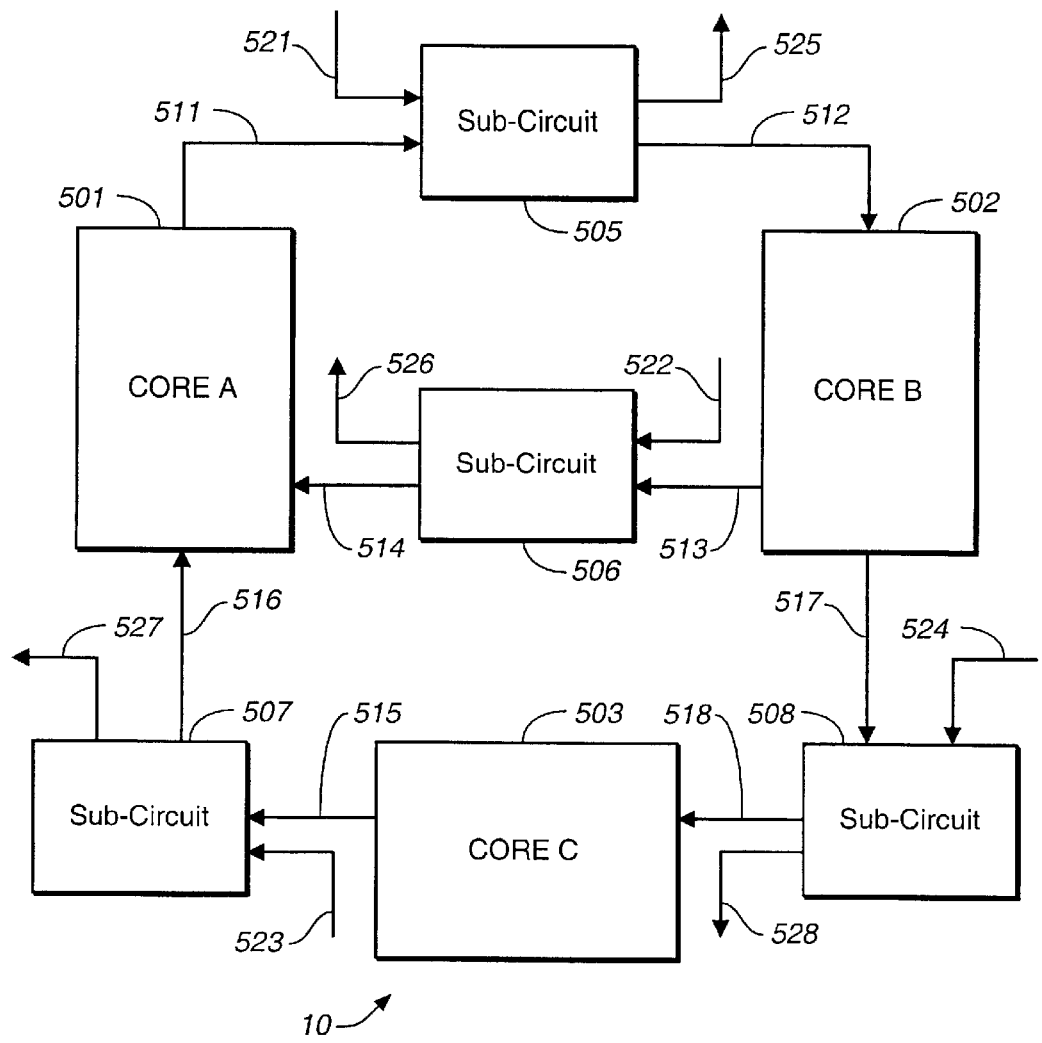
FIG._5

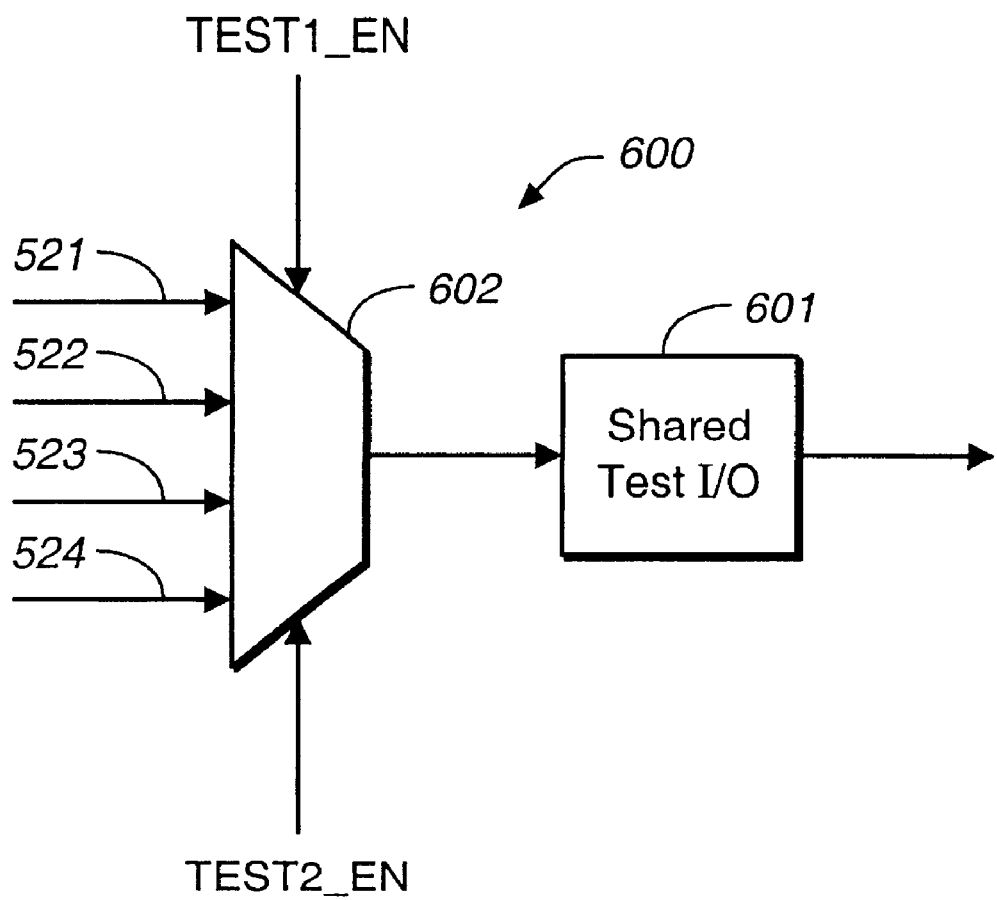
FIG._6

METHOD AND APPARATUS FOR TESTING AN INTERFACE BETWEEN SEPARATE HARDWARE COMPONENTS

CROSS-REFERENCE TO RELATED APPLICATIONS

This application claims priority under 35 U.S.C. §119 (e) on U.S. provisional application Ser. No. 60/199,277, entitled "Methodology for Testing Interface Between Separate Hard Cores in SOC (R/W and HDC)," filed Apr. 24, 2000, the contents of which are incorporated by reference herein.

FIELD OF THE INVENTION

The present invention relates to an interface testing circuit and method for testing an interface between two or more separate hardware components, such as between a read/write (R/W) module and a hard disk controller (HDC), fabricated on an integrated circuit.

BACKGROUND OF THE INVENTION

Testing of digital circuits at the chip, board, or system level is done, for example, to detect the presence of hardware failures caused by faults in the manufacturing processes. The behavior of a digital system is characterized by discrete responses to discrete operating state/input signal permutations, such that testing of a digital circuit may be achieved by checking its behavior under every operating mode and input signal permutation. While this approach is valid in principle, most digital circuits are too complex to be tested using such an exhaustive technique. Instead testing methods and tools have been developed to test digital circuits using only a fraction of all possible test conditions.

Such conventional hardware testing tools check internal gates within a hardware block. These tools generate vectors to test the inputs and outputs of the gates. However, a disadvantage of these tools is that they are not designed to test the interface between two hardware components. Furthermore, testing between two blocks may not be possible with conventional tools due to mixed signal (e.g., analog and digital) components.

SUMMARY OF THE INVENTION

It is therefore an object of the present invention to provide an interface testing system for testing an interface between two or more separate hardware components, such as between a hard disk controller (HDC) and read/write (R/W) module.

It is another object of this invention to provide such an interface testing system which does not require complex and expensive synchronized mixed signal testing between the hardware components.

According to one aspect of the invention, an interface testing circuit for testing an interface between a plurality of hardware components fabricated on an integrated circuit is provided. The interface testing circuit comprises one or more test input/output pads; a first sub-circuit, in communication with a test input/output pad, that is adapted to route a first test signal from that test input/output pad to one of the hardware components, or to route a first output signal from another one of the hardware components to that test input/output pad; and a second sub-circuit, in communication with a test input/output pad, that is adapted to route a second test signal from that test input/output pad to one of the hardware components, or to route a second output signal from another one of the hardware components to that test input/output pad.

In one embodiment, the first sub-circuit of the interface testing circuit routes the first test signal from the corresponding test input/output pad to a first hardware component, and the second sub-circuit routes the second output signal from the first hardware component to the corresponding test input/output pad.

Preferably, the first sub-circuit comprises a first multiplexer in communication with the corresponding test input/output pad, and a first AND gate in communication with the first multiplexer and that test input/output pad; and the second sub-circuit comprises a second multiplexer in communication with the corresponding test input/output pad, and a second AND gate in communication with the second multiplexer and that test input/output pad.

In one embodiment, the interface testing circuit comprises a single test input/output pad that the sub-circuits share. In another embodiment, each sub-circuit has its own test input/output pad.

In a preferred embodiment, the first multiplexer has a first input that receives the first test signal, a second input that receives the first output signal, and an output, the first multiplexer being responsive to a first select signal to select either the first test signal or the first output signal as the output of the first multiplexer, and the second multiplexer has a first input that receives the second test signal, a second input that receives the second output signal, and an output, the second multiplexer being responsive to a second select signal to select either the second test signal or the second output signal as the output of the second multiplexer.

Preferably, the first AND gate has a first input in communication with the output of the first multiplexer, a second input that receives the second select signal, and an output in communication with the corresponding test input/output pad, and the second AND gate has a first input in communication with the output of the second multiplexer, a second input that receives the first select signal, and an output in communication with the corresponding test input/output pad.

Another aspect of the invention involves a method for testing an interface between a plurality of hardware components fabricated on an integrated circuit. The method comprises the steps of (a) routing either a first test signal from a test input/output pad to one of the hardware components, or a first output signal from another one of the hardware components to the test input/output pad; and (b) routing either a second test signal from the test input/output pad to one of the hardware components, or a second output signal from another one of the hardware components to the test input/output pad.

In one embodiment step (a) comprises the step of routing the first test signal from the test input/output pad to a first hardware component, and step (b) comprises the step of routing the second output signal from the first hardware component to the test input/output pad.

In a preferred embodiment step (a) comprises the steps of (a)(1) receiving the first test signal, (a)(2) receiving the first output signal, and (a)(3) selecting, in response to a first select signal, either the first test signal or the first output signal, and step (b) comprises the steps of (b)(1) receiving the second test signal, (b)(2) receiving the second output signal, and (b)(3) selecting, in response to a second select signal, either the second test signal or the second output signal.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a schematic block diagram of an interface testing system, constructed in accordance with embodiments of the invention.

FIG. 2 is a schematic block diagram of a four port sub-circuit employed in the interface testing system of FIG. 1.

FIG. 3 is a schematic block diagram of a circuit for use with the interface testing circuitry of FIG. 1 and which reduces pin count.

FIG. 4 is a schematic block diagram of another circuit for use, with the interface testing circuitry of FIG. 1 and which reduces pin count.

FIG. 5 is a schematic block diagram of a more complex interface environment employing an interface testing system in accordance with embodiments of the invention.

FIG. 6 is a schematic block diagram of a pin-count-reducing circuit, similar to the circuit illustrated in FIG. 3, for use with the interface testing circuitry of FIG. 5.

DETAILED DESCRIPTION OF THE INVENTION

FIG. 1 is a schematic diagram of an interface testing circuit 10 for testing interface signals between two or more separate hardware components, e.g., between CORE1 12 and CORE2 14. CORE1 may be a hard disk controller (HDC), and CORE2 may be a read/write (R/W) module, for example, although the invention is not so limited. Rather, the interface testing system of the present invention may be employed in connection with any two or more functional hardware components that interface with each other.

In the illustrated embodiment of FIG. 1, the interface testing circuit 10 comprises a first sub-circuit 101 that includes a first multiplexer 16, a first AND gate 18, and a test input/output (I/O) pad 20. A second sub-circuit 102 of interface testing circuit 10 includes a second multiplexer 22, a second AND gate 24 and a test input/output (I/O) pad 26. I/O pads 20 and 26 may be implemented by a single shared test I/O pad by employing additional multiplexing, as described below. In the illustrated embodiment of FIG. 1, interface testing circuit 10 has two testing modes: a CORE1 mode that is used for testing signals input to, and output from, CORE1, and the CORE2 mode that is used for testing signals input to, and output from, CORE2.

In the CORE1 mode, a select signal CORE1_EN of multiplexer 16 is in a first binary logic state (e.g., 1), and a select signal CORE2_EN of multiplexer 22 is in a second binary logic state (e.g., 0). With CORE1_EN in the logic 1 state, multiplexer 16 selects as its output a test signal transmitted from test I/O pad 20 on signal path 32 to an input of multiplexer 16. When so selected, this test signal is transmitted on signal path 34 to an input of CORE1. With CORE2_EN in the logic 0 state, the signal on path 34 is not transmitted to test I/O pad 20 on signal path 36. That is, in this testing mode, the output signal of AND gate 18 is in the logic 0 state.

In addition, with CORE2_EN in the logic 0 state, multiplexer 22 selects as its output an output signal from CORE1 that is transmitted on signal path 38 to an input of multiplexer 22. When this CORE1 output signal is so selected, it is transmitted by multiplexer 22 on signal path 40. Because CORE1_EN is in the logic 1 state, a logic 1 signal is output from AND gate 24 on signal path 42 and input to test I/O pad 26 for testing using known analysis techniques.

Thus, in the CORE1 testing mode, a test signal from I/O pad 20 is routed to an input of CORE1 on signal paths 32 and 34, and an output signal of CORE1 is routed to test I/O pad 26 on signal paths 38, 40 and 42.

In the CORE2 testing mode, when multiplexer select signals CORE1_EN and CORE2_EN are set at logic 0 and logic 1 respectively, a test signal from I/O pad 26 is routed to the input of CORE2 on signal paths 44 and 40, while an output signal of CORE2 is routed to test I/O pad 20 on signal paths 46, 34 and 36.

To save pins, CORE1_EN and CORE2_EN may be operated from the same external pin by employing, an inverter before one or the other of the enable signal ports to which CORE1_EN and CORE2_EN are applied.

Referring now to FIG. 2, a block diagram illustrates a four port sub-circuit 200 which is used to implement sub-circuits 101 and 102. The sub-circuit is disposed between two separate hardware components that interface with one another. As shown in the figure, sub-circuit 200 has two input ports: an input port 201 that receives an input from a test I/O pad, which may be a shared pad, and an input port 202 that receives an input from one hardware component. Of the sub-circuit's two output ports, one output port 203 is used to selectively output a signal to a test I/O pad and the other output port 204 is used to selectively output a signal to another hardware component that interfaces with the hardware component from which sub-circuit 200 receives a signal at input port 202.

FIG. 3 illustrates a circuit for implementing test I/O pads 20 and 26 using a single shared test I/O pad, thereby reducing pin requirements and saving I/O pads. This circuit, identified generally by the reference numeral 300, comprises a single shared test I/O pad 301, which takes the place of test I/O pads 20 and 26 in FIG. 1, and a multiplexer 302 which selects either the signal output from AND gate 18 on path 36 or the signal output from AND gate 24 on path 42 and outputs the selected signal to shared test I/O pad 301. The test signal generated by the shared test I/O pad is supplied to both multiplexers 16 and 22.

FIG. 4 is a schematic diagram of a combinatorial logic device 401 that allows many internal pins or connections to share a few external pins. For example, the connections of multiplexers 16 and 22 to which CORE1_EN and CORE2_EN are selectively applied may be selectively connected, via device 401, to external pins while other internal pins are disconnected from the external pins, so that either the configuration code (i.e., the bit values of CORE1_EN and CORE2_EN) can either be set and applied externally, or checked externally if set internally. When needed, the other internal pins may be selectively accessed externally while the CORE1_EN and CORE2_EN connections are disconnected from the external pins.

FIG. 5 illustrates a more complex interface environment in which the interface testing circuit 10 may be employed. In the embodiment of FIG. 5, there are three hardware components: CORE A 501, CORE B 502 and CORE C 503 that interface with each other in a non-testing operational mode (i.e., when testing circuit 10 is not employed) as follows. CORE A receives two input signals, one from CORE B and the other from CORE C, and outputs one output signal to CORE B. CORE B receives one input signal from CORE A, and outputs two output signals, one to CORE A and the other to CORE C. CORE C receives an input signal from CORE B and outputs an output signal to CORE A. To fully test this particular interface, a first sub-circuit 505 is connected between the output of CORE A transmitted on path 511 and the input of CORE B transmitted on path 512, a second sub-circuit 506 is connected between the CORE B output on path 513 and the CORE A input on path 514, a third sub-circuit 507 is connected between the CORE C output on path 515 and the CORE A input on path 516, and a fourth sub-circuit 508 is connected between the CORE B output on path 517 and the CORE C input on path 518. As shown in FIG. 5, each of the sub-circuits 505–508 also has, in communication with a separate or shared test I/O pad, an input path 521–524 respectively, and an output path 525–528 respectively. There is a testing mode for each hardware component in which the input(s) and output(s) of that hardware component are tested, as previously described, by appropriately setting the configuration codes of the enable signals of the multiplexers in the sub-circuits.

FIG. 6 illustrates a circuit that is similar to the circuit shown in FIG. 3, except that the FIG. 6 circuit permits four test I/O pads to be implemented by a single shared test I/O pad, thereby further reducing pin requirements and saving I/O pads. This circuit, identified generally by the reference numeral 600, comprises a single shared test I/O pad 601 and a multiplexer 602 which selects one of the signals on paths 521–524 and outputs the selected signal to shared test I/O pad 601. The test signal generated by the shared test I/O pad is supplied to the multiplexers of sub-circuits 505–508. Other variations are possible, as will be apparent to those skilled in the art. For example, instead of using the 4×1 multiplexing circuit of FIG. 6, two of the circuits in FIG. 3 may be employed.

It should be readily apparent from the foregoing description that the interface testing system of the present invention provides a technique for testing the interface between two or more separate hardware components, such as an HDC and a R/W module, without requiring complex and expensive synchronized mixed signal production testing between the two components. Moreover, the interface testing system provides the capability of ensuring 100% interface coverage.

While embodiments of the invention have been described, it will be apparent to those skilled in the art in light of the foregoing description that many further alternatives, modifications and variations are possible. The invention described herein is intended to embrace all such alternatives, modifications and variations as may fall within the spirit and scope of the appended claims.

What is claimed is:

1. An interface testing circuit for testing an interface between a plurality of hardware components fabricated on an integrated circuit, comprising:
    at least one test input/output pad;
    a first sub-circuit comprising a first multiplexer in communication with the at least one test input/output pad, and a first AND gate in communication with the first multiplexer and the at least one test input/output pad, wherein the first sub-circuit is adapted to route a first test signal from the at least one test input/output pad to one of the hardware components, or to route a first output signal from another one of the hardware components to the at least one test input/output pad; and
    a second sub-circuit, in communication with the at least one test input/output pad, that is adapted to route a second test signal from the at least one test input/output pad to one of the hardware components, or to route a second output signal from another one of the hardware components to the at least one test input/output pad.

2. The interface testing circuit of claim 1, wherein the second sub-circuit comprises
    a second multiplexer in communication with the at least one test input/output pad, and
    a second AND gate in communication with the second multiplexer and the at least one test input/output pad.

3. The interface testing circuit of claim 2, wherein
    the first sub-circuit routes the first test signal from the at least one test input/output pad to a first hardware component, and
    the second sub-circuit routes the second output signal from the first hardware component to the at least one test input/output pad.

4. The interface testing circuit of claim 3, wherein
    the first multiplexer has a first input that receives the first test signal, a second input that receives the first output signal, and an output, the first multiplexer being responsive to a first select signal to select either the first test signal or the first output signal as the output of the first multiplexer, and
    the second multiplexer has a first input that receives the second test signal, a second input that receives the second output signal, and an output, the second multiplexer being responsive to a second select signal to select either the second test signal or the second output signal as the output of the second multiplexer.

5. The interface testing circuit of claim 4, wherein
    the first AND gate has a first input in communication with the output of the first multiplexer, a second input that receives the second select signal, and an output in communication with the at least one test input/output pad, and
    the second AND gate has a first input in communication with the output of the second multiplexer, a second input that receives the first select signal, and an output in communication with the at least one test input/output pad.

6. The interface testing circuit of claim 2, wherein the at least one test input/output pad comprises a single test input/output pad.

7. The interface testing circuit of claim 2, wherein the at least one test input/output pad comprises a plurality of test input/output pads, one for each sub-circuit.

8. The interface testing circuit of claim 2, wherein
    the first sub-circuit routes the second output signal from a second hardware component to the at least one test input/output pad, and
    the second sub-circuit routes the second test signal from the at least one test input/output pad to the second hardware component.

9. An interface testing circuit for testing an interface between a plurality of hardware components fabricated on an integrated circuit, comprising:
    first and second test input/output pads;
    a first sub-circuit, in communication with the first test input/output pad; and
    a second sub-circuit, in communication with the second test input/output pad,
        wherein in a first test mode, the first sub-circuit is adapted to route a first test signal from the first test input/output pad to one of the hardware components and the second sub-circuit is adapted to route a first output signal from the one of the hardware components to the second test input/output pad, and
        wherein, in a second test mode, the first sub-circuit is adapted to route a second output signal from another one of the hardware components to the first test input/output pad, and the second sub-circuit is adapted to route a second test signal from the second test input/output pad to the another one of the hardware components.

10. The interface testing circuit of claim 9, wherein
the first sub-circuit routes the first test signal from the first test input/output pad to a first hardware component, and
the second sub-circuit routes the first output signal from the first hardware component to the second test input/output pad.

11. The interface testing circuit of claim 9, wherein the first sub-circuit comprises
a first multiplexer in communication with the first test input/output pad, and
a first AND gate in communication with the first multiplexer and the first test input/output pad.

12. The interface testing circuit of claim 11, wherein the second sub-circuit comprises
a second multiplexer in communication with the second test input/output pad, and
a second AND gate in communication with the second multiplexer and the second test input/output pad.

13. The interface testing circuit of claim 12, wherein
the first multiplexer has a first input that receives the first test signal, a second input that receives the second output signal, and an output, the first multiplexer being responsive to a first select signal to select either the first test signal or the second output signal as the output of the first multiplexer, and
the second multiplexer has a first input that receives the second test signal, a second input that receives the first output signal, and an output, the second multiplexer being responsive to a second select signal to select either the second test signal or the first output signal as the output of the second multiplexer.

14. The interface testing circuit of claim 13, wherein
the first AND gate has a first input in communication with the output of the first multiplexer, a second input that receives the second select signal, and an output in communication with the first test input/output pad, and
the second AND gate has a first input in communication with the output of the second multiplexer, a second input that receives the first select signal, and an output in communication with the second test input/output pad.

15. The interface testing circuit of claim 9, wherein the first and second test input/output pads comprise a single test input/output pad.

16. The interface testing circuit of claim 9, wherein the first and second test input/output pads comprise a plurality of test input/output pads, one for each sub-circuit.

17. The interface testing circuit of claim 9, wherein
the first sub-circuit routes the second output signal from a second hardware component to the first test input/output pad, and
the second sub-circuit routes the second test signal from the second test input/output pad to the second hardware component.

18. An interface testing circuit for testing an interface between a plurality of hardware components fabricated on an integrated circuit, comprising:
first and second test input/output means for inputting and outputting signals for testing the interface;
first means for routing, in communication with the first test input/output means; and
second means for routing, in communication with the second test input/output means,
wherein, in a first test mode, the first means for routing routes a first test signal from the first test input/output means to one of the hardware components, and the second means for routing routes a first output signal from the one of the hardware components to the second test input/output means, and
wherein, in a second test mode, the first means for routing routes a second output signal from another one of the hardware components to the first test input/output means, and the second means for routing routes a second test signal from the second test input/output means to the another one of the hardware components.

19. The interface testing circuit of claim 18, wherein
the first means for routing routes the first test signal from the first test input/output means to a first hardware component, and
the second means for routing routes the first output signal from the first hardware component to the second test input/output means.

20. The interface testing circuit of claim 18, wherein the first means for routing comprises
first signal selecting means for selecting either the first test signal or the second output signal, and
first AND logic means for receiving an output of the first signal selecting means.

21. The interface testing circuit of claim 20, wherein the second means for routing comprises
second signal selecting means for selecting either the second test signal or the first output signal, and
second AND logic means for receiving an output of the second selecting means.

22. The interface testing circuit of claim 21, wherein
the first signal selecting means has means for receiving the first test signal, means for receiving the second output signal, and outputting means, the first signal selecting means being responsive to a first select signal to select either the first test signal or the second output signal as an output of the first signal selecting means, and
the second signal selecting means has means for receiving the second test signal, means for receiving the first output signal, and outputting means, the second signal selecting means being responsive to a second select signal to select either the second test signal or the first output signal as an output of the second signal selecting means.

23. The interface testing circuit of claim 22, wherein
the first AND logic means has means for receiving the output of the first signal selecting means, means for receiving the second select signal, and output means for outputting a signal to the first test input/output means, and
the second AND gate has means for receiving the output of the second signal selecting means, means for receiving the first select signal, and output means for outputting a signal to the second test input/output means.

24. The interface testing circuit of claim 18, wherein the first and second test input/output means comprise a single test input/output means.

25. The interface testing circuit of claim 18, wherein the first and second test input/output means comprise a plurality of test input/output means, one for each means for routing.

26. The interface testing circuit of claim 18, wherein the first means for routing routes the second output signal from a second hardware component to the first test input/output means, and the second means for routing routes the second test signal from the second test input/output means to the second hardware component.

27. A method for testing an interface between a plurality of hardware components fabricated on an integrated circuit, comprising the steps of:

(a) routing a first test signal from a first test input/output pad to one of the hardware components, and a first output signal from the one of the hardware components to a second test input/output pad; and (b) routing a second test signal from the second test input/output pad to another one of the hardware components, and a second output signal from the another one of the hardware components to the first test input/output pad.

28. The method of claim 27, wherein step (a) comprises the step of routing the first test signal from the first test input/output pad to a first hardware component, and comprises the step of routing the first output signal from the first hardware component to the second test input/output pad.

29. The method of claim 27, wherein step (a) comprises the steps of (a)(1) receiving the first test signal, (a)(2) receiving the first output signal, and (a)(3) selecting, in response to a first select signal, either the first test signal or the first output signal, and step (b) comprises the steps of (b)(1) receiving the second test signal, (b)(2) receiving the second output signal, and (b)(3) selecting, in response to a second select signal, either the second test signal or the second output signal.

30. The method of claim 27, wherein step (b) comprises the step of routing the second test signal from the second test input/output pad to a second hardware component, and comprises the step of routing the second output signal from the second hardware component to the first test input/output pad.

\* \* \* \* \*